United States Patent [19]

Saitou

[11] Patent Number: 5,343,065
[45] Date of Patent: Aug. 30, 1994

[54] METHOD OF CONTROLLING SURGE PROTECTION DEVICE HOLD CURRENT

[75] Inventor: Takashi Saitou, Yokohama, Japan

[73] Assignee: Sankosha Corporation, Tokyo, Japan

[21] Appl. No.: 961,360

[22] Filed: Oct. 15, 1992

[30] Foreign Application Priority Data

Dec. 2, 1991 [JP] Japan .................................. 3-341767

[51] Int. Cl.⁵ ............................................. H01L 29/92
[52] U.S. Cl. .................................. 257/355; 257/175; 257/481; 257/482; 257/603
[58] Field of Search ........................ 257/175, 428–429, 257/430, 438, 481, 482, 603–606, 355

[56] References Cited

U.S. PATENT DOCUMENTS 3,840,887 10/1974 Roberts et al. .
3,872,493  3/1975 Roberts et al. .
3,990,091 11/1976 Cresswell et al. .................. 257/175

FOREIGN PATENT DOCUMENTS 2907732  8/1980 Fed. Rep. of Germany ...... 257/175
54-138380 10/1979 Japan ..................................... 257/17
3-129879  6/1991 Japan .

Primary Examiner—J. Carroll
Attorney, Agent, or Firm—Oblon, Spivak, McClelland, Maier & Neustadt

[57] ABSTRACT

The hold current of a breakover type surge protection device is increased by irradiating the device with γ or x rays so as to form crystal lattice defects in the semiconductor regions thereof.

10 Claims, 2 Drawing Sheets

METHOD OF CONTROLLING SURGE PROTECTION DEVICE HOLD CURRENT

BACKGROUND OF THE INVENTION

1. Field of the Invention

This invention relates to a method of controlling the hold current of a surge protection device for protecting electric circuits from abnormally high voltages and currents caused by, for example, lightning, switching surges or the like.

2. Prior Art Statement

A wide range of devices referred to as surge protection devices have been devised. Even the number of such devices that fall in the category of two-terminal surge protectors is considerable. The better of these are not limited to the function of clamping the voltage across the device terminals at a fixed breakdown voltage at the time of breakdown caused by occurrence of a surge (i.e. do not function simply as constant-voltage diodes). Instead they further exhibit negative characteristics when the absolute value of the device current that begins to flow at the time the device breakdown increases to above the breakover current value. As a result of this breakover, the voltage across the terminals after breakdown is shifted to a clamp voltage that is lower than the breakdown voltage. It therefore becomes possible to absorb large currents.

Among the surge protection devices of this type some utilize avalanche or Zenner breakdown as the initial breakdown mechanism, while others use punch-through for this purpose. U.S. Pat. No. 5,083,185 teaches a number of surge protection devices which, though being of various types, all have one of the basic structures shown in FIGS. 1 and 3.

FIG. 1 is a sectional view of a surge protection device 10 having a first semiconductor region 1 constituted by a semiconductor wafer or semiconductor substrate. While the first semiconductor region 1 is shown as being of p conductivity type in the drawing, it can instead be of n type. A second semiconductor region 2 and a third semiconductor region 3 are successively formed on one principal surface of the semiconductor region 1, ordinarily by double diffusion. A fourth region 4 is formed on the other principal surface.

Structurally speaking, the surge protection device 10 shown in FIG. 1 is formed with the regions 1, 2, 3 and 4 stacked vertically in the thickness direction of the region 1. Moreover, as will be clear from the explanation of the device's operation given later, the device current resulting from surge absorption flows mainly in the thickness direction of the first region, between the third and fourth regions. The device can therefore be said to be of the vertical type. While not shown in the drawings, there is also a lateral type surge protection device in which the fourth region 4 is situated on the front surface at a position offset laterally from the second and third regions 2, 3. In the interest of simplicity, only the vertical type device will be explained in the following.

The second region 2 and fourth region 4 have to be of opposite conductivity type from the first region 1. Therefore, as shown in the figures, in the case where the first region 1 is of p conductivity type, the second region 2 and the fourth region 4 are of n conductivity type. In actual practice, it is usually better for them to be of somewhat low concentration n type ($n^-$ type). On the other hand, since the third region 3 constitutes one end of the main device current path after breakdown, it preferably has high conductivity. That is to say, it is preferably a high concentration semiconductor region. It can be constituted of a silicide, for example. When, differently from what is shown in the drawing, the first semiconductor region 1 is of n conductivity type and the second semiconductor region 2 is of p conductivity, the third region can be formed of metal. In general, when the third region is constituted of semiconductor, its conductivity type is selected to be opposite that of the second region 2. Thus in the illustrated case, it is of p type (preferably of $p^+$ type).

The same can also be said of the fourth region 4. That is to say, since it suffices for the fourth region 4 to be able to inject into the first semiconductor region 1 carriers that are minority carriers in the first region 1, it does not necessarily have to be constituted of semiconductor but can be constituted of a metal material, for example, or of a silicide if the first semiconductor region 1 is of n type. If it is constituted as a semiconductor region, then the first semiconductor region 1 has to be of the opposite conductivity type, namely of n type (preferably $n^-$ type). While in some cases the third region 3 and the fourth region 4 are each formed of a plurality of laterally spaced sub-regions, for the purposes of the explanation given here the groups of sub-regions can be considered to be represented by the single regions shown in the drawings.

As the device terminals of the surge protection device 10 having the aforesaid sectional structure there are provided a first device terminal $T_1$ which is in ohmic contact with both the second semiconductor region 2 and the third region 3 and a second device terminal $T_2$ which is in ohmic contact with the fourth region 4.

This requires an electrode structure formed of an appropriate conductive material. In the illustrated arrangement, an opening is provided in the principal surface insulation film 61 on the front side of the first semiconductor region 1 and a first electrode 71 is formed in this opening so as to make ohmic contact with both the third region 3 and the second semiconductor region 2. The first device terminal $T_1$ is led out from the first electrode 71. On the other hand, an opening is provided in the principal surface insulation film 62 on the rear side and a second electrode 72 is provided both within and beyond the edges of this opening so as to make ohmic contact with the surface of the fourth region 4. The second device terminal $T_2$ is led out from the second electrode 72.

In the aforesaid sectional structure, when a surge voltage arises across the first and second device terminals $T_1$, $T_2$ at a relatively large magnitude and in such phase as to apply a reverse bias voltage across the pn junction between the first region 1 and the second region 2 (in the illustrated case, in the phase that causes the first device terminal $T_1$ to become positive), either breakdown, avalanche or Zenner, occurs at the pn junction between the first and second regions or the upper extremity of the depletion layer produced at the pn junction between the first and second regions reaches the third region 3, resulting in punch-through state.

On the other hand, carriers which will be minority carriers in the first region 1 are injected into the first region 1 from the fourth region 4. Since the injected minority carriers collect in the second region 2, device current begins to flow. The voltage at which this operation starts is indicated in the operating characteristics of the surge protection device 10 shown in FIG. 2 as breakdown voltage $V_{BR}$.

Even if the second region 2 and the third region 3 should be electrically shorted at their surfaces by mutual connection with the second device terminal $T_2$, once the flow of minority carriers starts via the second region 2 and rises to the point that the product between itself and the resistance along the path thereof in the second region 2 (the voltage drop) becomes equal to the forward voltage at the rectifying junction formed between the second region 2 and the third region 3 (the pn junction in the illustrated case), the pn junction turns on so that minority carriers for the second region 2 are injected from the third region 3 into the second region 2.

This injection of minority carriers into the second region 2 causes the device current flowing between the first and second device terminals $T_1$, $T_2$ to become even larger, as indicated in FIG. 2 by the portion of the characteristic curve where the curve rises rapidly in the direction of the current axis. Since this in turn promotes the injection of minority carriers from the fourth region 4 into the first region 1, a positive feedback is obtained. Thus, as can be seen from the voltage vs current (V-I) characteristic curve in FIG. 2, when the current flowing between the first and second device terminals $T_1$, $T_2$ becomes greater than the value indicated as the breakover current $I_{BO}$, the positive feedback within the device manifests itself in the form of a negative characteristic. As a result, the voltage across the first and second terminals $T_1$, $T_2$ shifts to a clamp voltage (or ON voltage) $V_P$ that is lower than the breakover voltage $V_{BO}$ at which breakover commenced and also lower than the breakdown voltage $V_{BR}$ at which breakdown started. Therefore, the device is able to absorb large surge currents while holding down the amount of heat it generates.

The maximum current which the surge protection device 10 can absorb across its first and second terminals $T_1$, $T_2$ is generally referred to as its "surge absorption capacity." On the other hand, the minimum device current capable of maintaining the device in its on state after it has once turned on is called its "hold current" $I_H$. That is to say, after the surge has subsided and it is no longer possible to maintain a current through the device that is at least as large as the hold current $I_H$, the device automatically resumes its earlier (turned off) state, thus returning to the state prior to the occurrence of the surge.

Let us now consider the "follow current effect" as it relates to the hold current $I_H$.

A surge protection device of this type is ordinarily connected between the power source and a load circuit (the circuit to be protected) so as to be in parallel with the load circuit. Owing to the aforesaid breakover mechanism, therefore, when the clamp voltage $V_P$ at the time the surge protection device is turned on is lower than the power source voltage, the surge protection device will remain in the on state even after the cause of the surge has disappeared and thus continue wasteful consumption of electric power. This is known as the "follow current effect" and is basically undesirable.

One way of overcoming this problem is to design the device to have a high clamp voltage $V_P$. However, this is usually not practical since the clamp voltage $V_P$ is related to the breakover voltage $V_{BO}$ and generally cannot be specified independently. Another way is to set the hold current $I_H$ at a high value (though it cannot be set too high because this too will of course also increase the amount of power consumed by the device). In the past, this expedient has not worked very well either. More will be said about this later.

Obviously a surge protection device having the structure just explained with respect to FIG. 1 is able to absorb surges of only one polarity. Specifically, the surge has to be of the polarity which causes the first device terminal $T_1$ side to become positive. The device is thus a single polarity surge protector. In contrast, the structure shown in FIG. 3 is one example of a conventional device structure that is capable of absorbing surges of either polarity, notwithstanding that it is based on approximately the same structural principle as the device of FIG. 1. Since the exemplified structure possesses all of the constituent elements of the earlier described surge protection device 10 constituted for absorption of surges of a single polarity, these elements are assigned the same reference symbols as in the earlier example. Except as otherwise stated, the whole of the explanation given above also applies to these elements.

One newly required condition for realizing a device for absorbing surges of either polarity is that, like the second semiconductor region 2, the fourth region 4 also be limited to being a semiconductor region which forms a pn junction between itself and the first semiconductor region 1. Further, there is additionally provided a fifth region 5 which is able to inject into the fourth semiconductor region 4 carriers that are minority carriers from the viewpoint of the fourth region 4 and which, together with the fourth semiconductor region 4, is electrically connected with the second device terminal $T_2$ (the contact of the fifth region with the fourth region being from the side opposite from that in contact with the first semiconductor region 1).

With this arrangement, the fourth semiconductor region 4 performs exactly the same function as the region 4 of the earlier described surge protection device for absorbing surges of a single polarity. Moreover, when a surge of the opposite polarity is applied, that is when, in the drawing, the first device terminal $T_1$ becomes negative and the second device terminal $T_2$ becomes positive, the fourth semiconductor region 4 functions as a semiconductor region equivalent to the second semiconductor region 2 and, in exactly the same way, when the surge of opposite polarity being discussed here is applied, the fifth region operates in place of the third region in the same way as the third region. Therefore, as regards the V-I characteristics, there appears in the third quadrant of FIG. 2 a hysteresis curve symmetrical with respect to the origin to that shown in the first quadrant. While, as is true of the third region 3, the fifth region 5 is also preferably constituted of high concentration p type semiconductor, in view of the operating principle involved, it is not limited to this constitution and need only have high conductivity, as is preferable in view of the fact that it constitutes one end of the main device current path after breakdown. It can therefore alternatively be constituted of silicide or, depending on the conductivity type of the first semiconductor region 1, of metal.

In the foregoing explanation no distinction was made among avalanche breakdown, Zenner breakdown and punchthrough. However, the thicknesses of the second semiconductor region 2 and the third region 3 (as well as the thickness of the fourth semiconductor region 4 and the fifth region 5 in a device capable of absorbing surges of either polarity), the geometric parameters of the individual regions, the impurity parameters thereof and the like have to be optimally selected in the light of the particular breakdown mechanism employed. It should be understood, however, that the relationship among the laminated layers remains as schematically illustrated in FIGS. 1 and 3 irrespective of the breakdown mechanism. In addition, the foregoing explanation also applies substantially without modification even with respect to a surge protection device which uses the lateral structure touched on briefly earlier in place of the illustrated vertical structure.

Whatever the initial breakdown mechanism may be, a surge protection device of the aforesaid type is desired to exhibit various electrical properties, typical of which are 1) Stable breakover voltage $V_{BO}$,
2) Large surge absorption capacity, and
3) A well-designed hold current $I_H$ that is of an appropriately large magnitude and varies little between different devices.

For a surge protection device of this type, the most fundamental of these properties is the breakover voltage $V_{BO}$ (which is why this voltage is also referred to simply as the "operating voltage"). Unless every effort is made to ensure that this voltage is close to that stipulated by the device design specifications, the resulting product will be of little or no commercial value.

Since the breakover voltage $V_{BO}$ is governed almost totally by the characteristics of the pn junction at the start of breakdown, the impurity concentrations of the semiconductor substrate 1 and the second semiconductor region 2 are subject to considerable limitation, as is the impurity concentration of the fourth semiconductor 4 as well in the case of the surge protection device shown in FIG. 3. What becomes a problem here is the impurity concentration distribution of the semiconductor substrate used as the first semiconductor region 1. Even with today's semiconductor wafer technology, this distribution is generally quite uneven, with a difference of around 5% or more existing between the center and peripheral regions of the substrate. Moreover, it is also impossible to avoid uneven impurity concentration distribution at the time of forming the second and third regions in such a substrate 1.

Notwithstanding, thanks to various improvements that have been implemented, it is now possible to hold the deviation between the actual and target values of the breakover voltage $V_{BO}$ to within 10%. Similarly, numerous innovations have made it possible to bring the surge absorption capacity mentioned in 2) above up to a considerably high level.

Regarding hold current, however, no effective means is yet available which can be applied in the fabrication process for providing the properties set out in 3) above. One principal reason for this is that the hold current is affected by the current amplification factors at the equivalent transistor structures constituted by the first, second and third regions and by the second, third and fourth regions. As a result, the hold current is sensitive to and varies largely with even slight differences in the concentration and diffusion depth of diffused impurities and in the impurity concentration distribution of the substrate. Thus, while it has been possible to fabricate surge protection devices with desired hold current values on a small-scale, test manufacture basis, it has been found extremely difficult to achieve like results in volume production.

In production it has in fact up to now been found necessary to check the electrical properties of each wafer in the course of the manufacturing process and to modify the ensuing processing steps in line with the detected values. Even so, product yield has been highly unsatisfactory. For example, when 2,500 devices according to the basic structure shown in FIG. 3 were fabricated to have a breakover voltage of 150 V, the value of the hold current $I_H$ was found to vary greatly within a range of 150 to 800 mA. The product yield based on a hold current in the range of 250–350 mA as being acceptable was under 20%.

The present invention was accomplished in the light of the foregoing circumstances and has as its object to provide a method of controlling surge protection device hold current for enabling easy improvement of the hold current value of a breakover type surge protection device.

SUMMARY OF THE INVENTION

For achieving the aforesaid object, this invention provides a method of controlling surge protection device hold current by irradiating a surge protection device whose hold current value requires improvement to $\gamma$ rays, x rays or other such electromagnetic rays.

When the device is irradiated with electromagnetic waves, crystal lattice defects are produced uniformly and at low concentration throughout the semiconductor regions constituting the device. These defects produce an effect that is equivalent to that obtained by the introduction of impurity and since the defects act as carrier traps during turn-on, the value of the hold current is increased.

The invention thus consists solely in irradiating the device with electromagnetic rays, and by controlling the radiation dosage the hold current can be increased. Therefore, by applying the invention to completed devices whose hold current does not attain at least a prescribed minimum value, it becomes possible to convert them into marketable products. The result is an effective increase in product yield.

The above and other features of the present invention will become apparent from the following description made with reference to the drawings.

DESCRIPTION OF THE PREFERRED EMBODIMENTS

Figure 1:
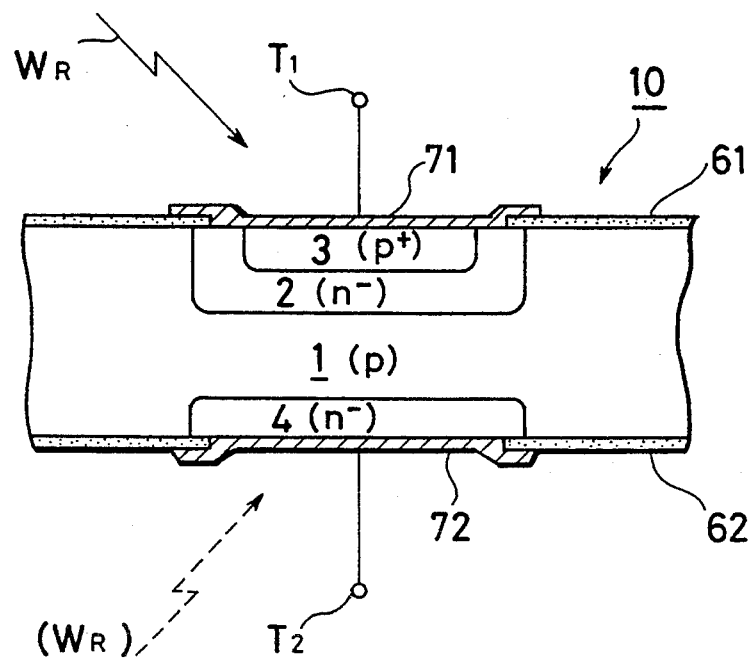
FIG. 1 is a schematic sectional view showing the invention being applied to a surge protection device for absorbing surges of a specific polarity.
Figure 2:
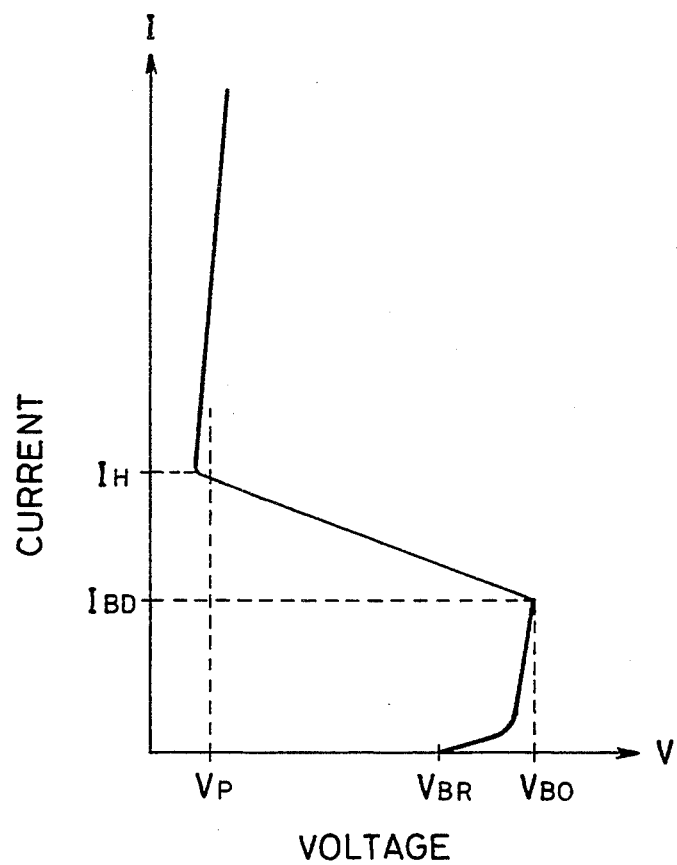
FIG. 2 is a graph showing the operation of the surge protection device of FIG. 1 in terms of its voltage-current characteristics.
Figure 3:
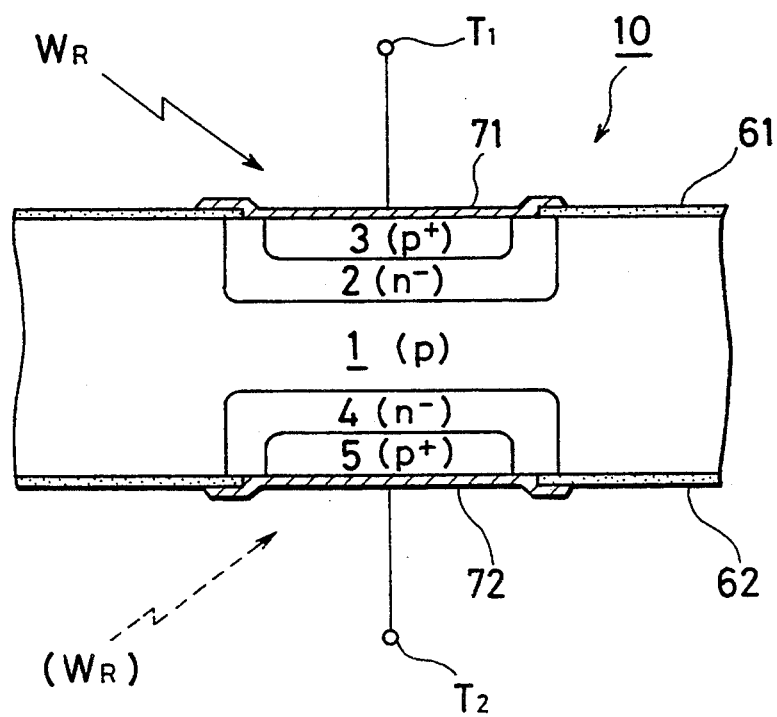
FIG. 3 is a schematic sectional view showing the invention being applied to a surge protection device for absorbing surges of either polarity.

FIGS. 1 and 3 show breakover type surge protection devices 10 to which the present invention can be applied. As was explained earlier, these devices can be of unmodified conventional configuration.

Since the structures of the devices of FIGS. 1 and 3 were explained in the foregoing, no further explanation will be given here. If, per the example set out earlier, a large number of surge protection devices according to the configuration of FIG. 3 are produced with the intention of providing each with an operating voltage of 150 V and a hold current $I_H$ of, say, 300 mA±50 mA, the hold current values of the devices actually obtained are spread over a range of 150 mA to 800 mA.

In such a case, in accordance with the present invention those of the structurally complete surge protection devices 10 which exhibit hold currents lower than the prescribed value are, as indicated by the arrows $W_R$ in FIGS. 1 and 3, irradiated from the outside over all effective regions thereof with electromagnetic rays, specifically with γ rays or x rays.

Figure 4:
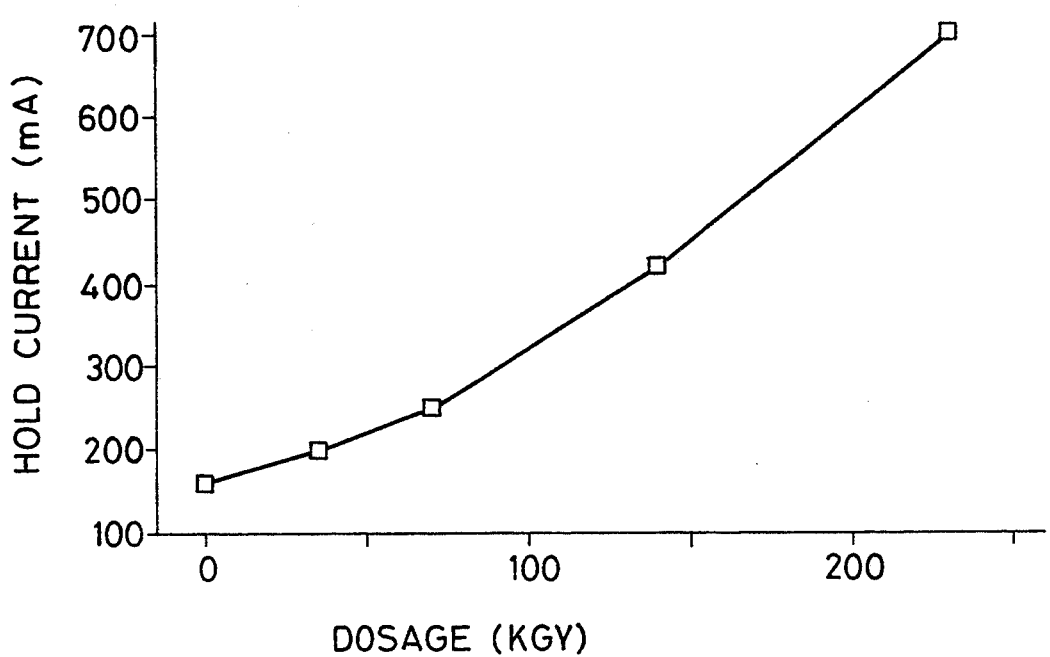
FIG. 4 is a characteristic curve showing the hold current control effect of the invention.

When sample devices whose hold currents $I_H$ were only about 150 mA or so, i.e. below the target value, at the time they were structurally completed were uniformly irradiated with γ rays from a Co60 γ ray source at a dosage of 40 KGy, their hold currents $I_H$ were upgraded to around 200 mA, as shown in FIG. 4. Further, when the dosage was increased to 70 KGy, their hold currents $I_H$ increased to 250 mA or higher, which is within the acceptable range for marketable products.

Additional tests in which the radiation dosage was further increased showed that, as can be seen in the graph of FIG. 4, the hold current $I_H$ increases almost linearly with increasing dosage.

Moreover, the increase in hold current value occurred not only in specific specimens but equally in all of the specimens. For example, when 4,000 specimens with hold currents $I_H$ in the range of 250 mA±100 mA were irradiated with γ rays from a Co60 source at a dosage of 55 KGy, all 4,000 of the specimens experienced an increase in their hold currents values to within the range of 370 mA±140 mA. Further, when specimens whose hold currents were on the high side (500 mA) were subjected to the γ ray irradiation treatment, their hold currents rose to 700 mA.

What this means is that where breakover type surge protection devices are fabricated by conventional processes, even if without any particular check or control of the hold current in the course of the production process, those devices which would conventionally be discarded as rejects for not achieving the target hold current $I_H$ (the value according to the design specifications) can be converted into marketable products by checking the hold current $I_H$ of each device after it is completed and then subjecting only those devices with hold current values that are lower than the target value to irradiation with electromagnetic rays at a dosage selected according to the amount of improvement required so as to increase their hold current values into the acceptable range. The effect of this is to increase product yield greatly.

The foregoing facts also lead to the conclusion that for effective utilization of the invention it is advantageous to design and fabricate the products with the target hold current value set slightly lower than that desired in the final products. This is because products with low hold currents can be remedied after fabrication, whereas there is no cure available for those with hold currents that fall above the acceptable range.

As shown in FIG. 4, in the specimens that were tested the hold current value increased with increasing γ radiation dosage. Where high-energy radiation is involved, however, it is preferable to keep the amount of irradiation to the minimum required.

Generally speaking, it suffices to conduct the irradiation with γ rays with respect to only one principal surface of the device 10, as indicated by the solid arrows $W_R$ in FIGS. 1 and 3. If necessary, however, additional irradiation can be conducted from the rear surface, as indicated by the dashed arrows in the same figures.

The improvement in hold current is obtained by deliberately producing crystal lattice defects through the irradiation with electromagnetic rays. More specifically, the irradiation with γ rays of those regions of a breakover type surge protection device of this type which play a part in the breakover mechanism and thus in the turn-off mechanism (mainly the first semiconductor region 1 and the second semiconductor region 2 in the structure of FIG. 1 and these same regions plus the fourth semiconductor region 4 in the structure of FIG. 3) produces crystal lattice defects throughout these regions. These defects produce an effect that is equivalent to that obtained by the deliberate introduction of impurity, and since they act as carrier traps during turn-on, the value of the hold current is increased.

In view of the mechanism involved, it is also possible to obtain exactly the same effect by using as the electromagnetic rays x rays instead of γ rays.

Tests were also conducted to learn whether the effect can also be obtained using other types of radiation, namely α rays, β rays, neutron beam or the like. None of these was usable, however, owing to the shortcomings set out below.

Since α particles and neutrons have large mass and thus interact strongly with the crystal atoms, they tend to damage the surfaces of the device (particularly the surfaces of the substrate, which is the dominate region of the device). This degrades other device properties.

In the case of β rays, the electrons penetrate the crystal of the device to a fixed depth determined by the energy of the electrons so that crystal lattice defects are produced only at this depth. Thus while β rays may be useful for producing a localized crystal lattice defect region, they are not appropriate for use in the invention where the aim is to increase the hold current. Where the aim is to increase the hold current by using crystal lattice defects as carrier gaps during device operation, the production of localized crystal lattice defects is not preferable because the localized defects tend to localize energy consumption and concentrate heat generation.

In other words, for achieving the object of the present invention it is preferable for the crystal lattice defects to be distributed throughout the regions where they are required with the highest possible uniformity and at low concentration. Although the high transmittance of γ and β rays with respect to the silicon substrate or the like ordinarily used as the substrate material in a device of this type reduces the probability of their interaction with crystal atoms, at adequate dosage levels they enable uniform, low-density formation of crystal lattice defects in the subject regions. These rays also exhibit high transmittance with respect to the resin sealing materials with which the devices are coated. Thus when structurally complete devices were sealed in resin (thus giving them the appearance of the final product) and thereafter irradiated with γ rays, it was found that the irradiation produced a hold current increasing effect not substantially different from that indicated by the characteristic curve of FIG. 4.

As is clear from the foregoing, where irradiation of the device from the exterior with electromagnetic rays $W_R$ is used for producing crystal lattice defects uniformly and at low concentration in at least one of the first semiconductor region 1 and the second semiconductor region 2 in the case of the surge protection device for absorbing surges of a single polarity shown in FIG. 1 and in at least one of the first semiconductor region 1, second semiconductor region 2 and fourth semiconductor region 4 in the case of the surge protection device 10 for absorbing surges of either polarity shown in FIG. 3, the hold current of the device increases accordingly.

The fact that the invention calls for the device to be irradiated with the electromagnetic rays $W_R$ from the exterior means that where the device has the structure shown in FIG. 1 or 3, the remaining regions 3 and/or 5 will also be uniformly formed with crystal lattice defects at a given rate. However, it has been ascertained that this gives rise to no problem whatsoever as regards the device characteristics and that the advantage of being able to control the hold current totally outweighs any possible demerits.

The principle on which the invention is based makes it applicable not only to the vertical type device focused on in the foregoing explanation but also to the lateral type touched on briefly earlier. Nor is there any reason for it not being applicable to surge protection devices of other well-known structures not shown in the drawings. In addition, while the invention has been explained from the point of its ability to enable devices which would in the past be discarded as rejects to be converted into marketable products by irradiation with electromagnetic rays, it is also significant in that it makes it possible to supply surge protection devices with any desired hold current value, merely by irradiating structurally complete devices with electromagnetic rays.

In the production of breakover type surge protection devices, the present invention enables the hold current value of the device to be controlled in a contactless manner from the exterior after the device has been structurally completed and, optionally, even after it has been sealed in resin, without any need for carrying out precision control with respect to the individual wafers in the course of the fabrication process.

Therefore, since it enables devices with low hold current values to be salvaged, in effect greatly increasing product yield, it makes it possible to establish volume production lines. Control of the hold current value to an arbitrary desired value is relatively easy.

The invention also has the effect of enabling other properties of the substrate used, e.g. the breakover voltage, to be selected as desired, which is also of considerable significance in practical applications.

What is claimed is:

1. A method of controlling surge protection device hold current in a surge protection device which breaks over upon application across a pair of terminals thereof of a surge of a voltage higher than its breakover voltage, absorbs surge current while shifting the voltage across the pair of terminals to a clamp voltage lower than the breakover voltage and, after breakover, turns off when device current flowing between the pair of terminals falls to or below a hold current, the method comprising irradiating the surge protection device with electromagnetic radiation from the exterior so as to increase its hold current.

2. A method according to claim 1, wherein the surge protection device irradiated with electromagnetic rays is a completed surge protection device.

3. A method according to claim 2, wherein the hold current value of the surge protection device before the increase of the hold current is lower than a prescribed minimum value.

4. A method according to claim 3, wherein a dosage of the electromagnetic ray irradiation is decided on the basis of how far the hold current value is below the prescribed minimum value.

5. A method according to claim 1, wherein the electromagnetic rays are $\gamma$ rays.

6. A method according to claim 1, wherein the electromagnetic rays are x rays.

7. A method of controlling surge protection device hold current in a surge protection device which breaks over upon application across a pair of terminals thereof of a surge of a voltage higher than its breakover voltage, absorbs surge current while shifting the voltage across the pair of terminals to a clamp voltage lower than the breakover voltage and, after breakover, turns off when device current flowing between the pair of terminals falls to or below a hold current, the method comprising the steps of:

measuring the hold current of the surge protection device after it has been structurally completed, comparing the measured hold current value with a prescribed target hold current value, and only if the measured hold current value is lower than the prescribed target hold current value, irradiating the surge protection device with electromagnetic rays from the exterior so as to increase its hold current.

8. A method according to claim 7, wherein a dosage of the electromagnetic ray irradiation is decided on the basis of how far the measured hold current value is below the prescribed target hold current value.

9. A method according to claim 7, wherein the electromagnetic rays are $\gamma$ rays.

10. A method according to claim 7, wherein the electromagnetic rays are x rays.

* * * * *